United States Patent
Yokomizo

(10) Patent No.: US 11,380,489 B2
(45) Date of Patent: Jul. 5, 2022

(54) CHIP ELECTRONIC COMPONENT AND ELECTRONIC COMPONENT MOUNTING STRUCTURE

(71) Applicant: Murata Manufacturing Co., Ltd., Nagaokakyo (JP)

(72) Inventor: Satoshi Yokomizo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/846,798

(22) Filed: Apr. 13, 2020

(65) Prior Publication Data
US 2020/0343048 A1    Oct. 29, 2020

(30) Foreign Application Priority Data

Apr. 26, 2019 (JP) .............. JP2019-086320

(51) Int. Cl.
| | |
|---|---|
| *H01G 4/30* | (2006.01) |
| *H01G 4/12* | (2006.01) |
| *H01G 4/248* | (2006.01) |
| *H01G 4/012* | (2006.01) |

(52) U.S. Cl.
CPC .............. *H01G 4/30* (2013.01); *H01G 4/012* (2013.01); *H01G 4/12* (2013.01); *H01G 4/248* (2013.01)

(58) Field of Classification Search
CPC ............ H01G 4/30; H01G 4/02; H01G 4/248; H01G 4/085; H01G 4/008; H01G 4/012; H01G 4/33; H01L 28/82
See application file for complete search history.

(56) References Cited

U.S. PATENT DOCUMENTS

| | | | |
|---|---|---|---|
| 10,062,511 B1 * | 8/2018 | Park .................. | H01G 2/06 |
| 2014/0231996 A1 * | 8/2014 | Fujisawa ............ | H05K 3/3485 |
| | | | 257/746 |
| 2015/0206661 A1 | 7/2015 | Fujimura et al. | |
| 2016/0007446 A1 * | 1/2016 | Ishikawa ............ | H01G 4/30 |
| | | | 174/260 |

(Continued)

FOREIGN PATENT DOCUMENTS

| | | |
|---|---|---|
| CN | 105849835 A | 8/2016 |
| CN | 108806983 A | 11/2018 |

(Continued)

OTHER PUBLICATIONS

Official Communication issued in corresponding Korean Patent Application No. 10-2020-0045088, dated Aug. 6, 2021.

(Continued)

*Primary Examiner* — Michael P McFadden
(74) *Attorney, Agent, or Firm* — Keating & Bennett, LLP

(57) ABSTRACT

A chip electronic component includes a stack, a first external electrode disposed at least on a first end surface and a first main surface of the stack, a second external electrode disposed at least on a second end surface and a first main surface of the stack, a first bump disposed at least on a portion of the first external electrode on the first main surface, and a second bump disposed at least on a portion of the second external electrode on the first main surface. The first bump and the second bump each have a porosity greater than or equal to about 5% and less than or equal to about 40%.

20 Claims, 10 Drawing Sheets

(56) References Cited

U.S. PATENT DOCUMENTS

| | | | |
|---|---|---|---|
| 2016/0133386 A1* | 5/2016 | Park | H05K 3/301 |
| | | | 361/767 |
| 2017/0042029 A1 | 2/2017 | Nishimura et al. | |
| 2017/0154767 A1* | 6/2017 | Mischitz | H01L 21/02107 |
| 2018/0108481 A1* | 4/2018 | Tomizawa | H01G 4/2325 |
| 2018/0323010 A1 | 11/2018 | Park et al. | |
| 2019/0287719 A1 | 9/2019 | Fujita et al. | |

FOREIGN PATENT DOCUMENTS

| | | |
|---|---|---|
| JP | 2015-135910 A | 7/2015 |
| JP | 2015-176998 A | 10/2015 |
| KR | 10-2015-0118385 A | 10/2015 |
| KR | 10-2015-0127965 A | 11/2015 |
| WO | 2018/101405 A1 | 6/2018 |

OTHER PUBLICATIONS

Official Communication issued in corresponding Japanese Patent Application No. 2019-086320 dated Oct. 26, 2021.
Official Communication issued in corresponding Chinese Patent Application No. 202010336508.4, dated Jul. 6, 2021.

\* cited by examiner

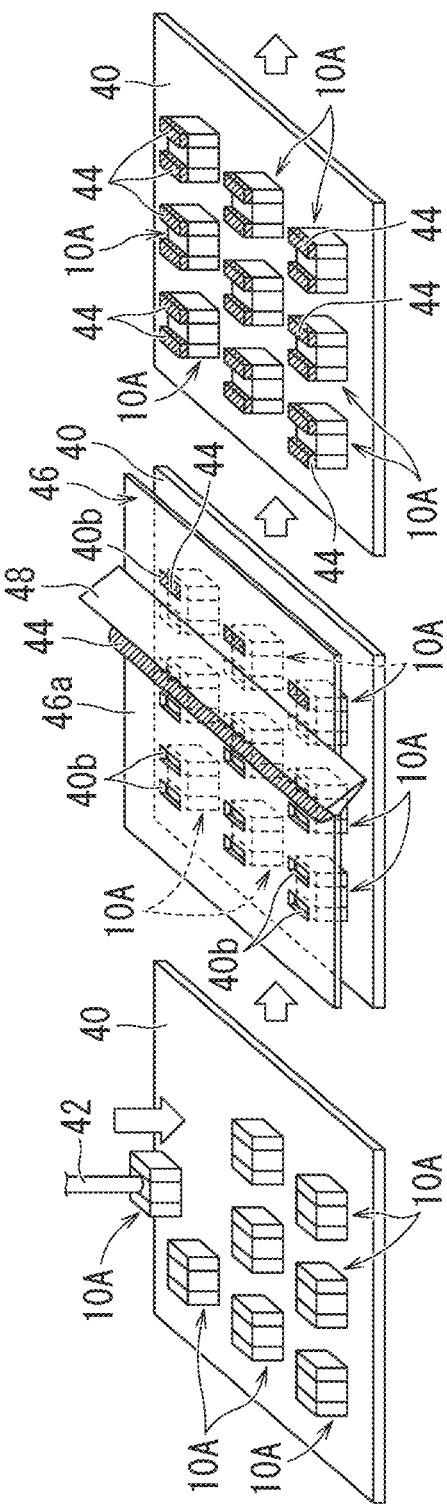

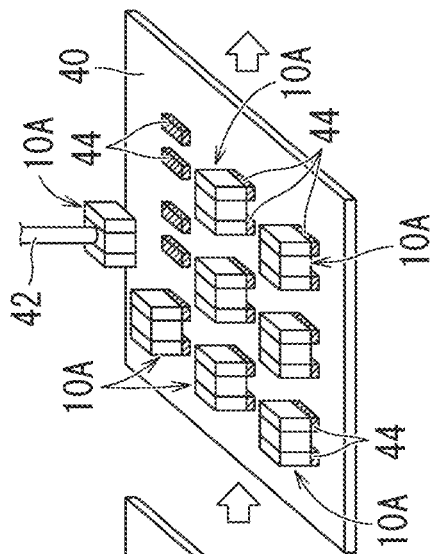
FIG.9A  FIG.9B  FIG.9C
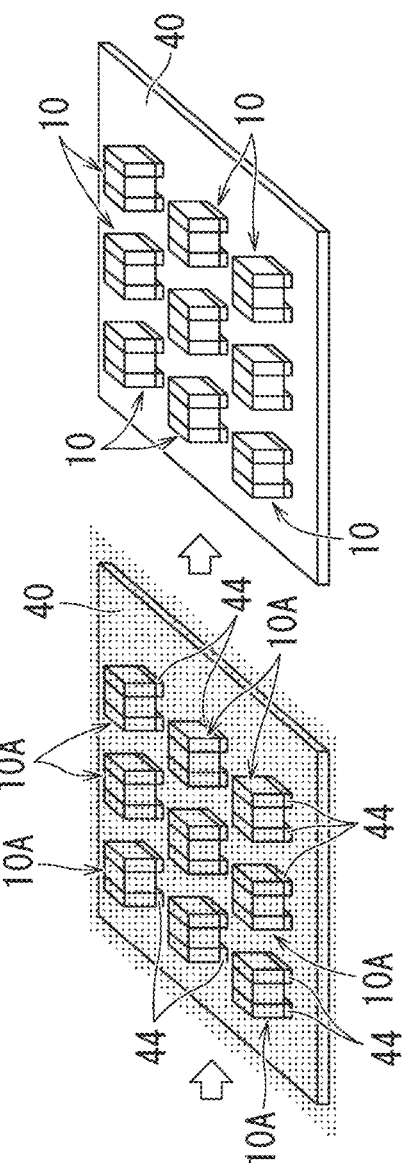
FIG.9D
FIG.9E

CHIP ELECTRONIC COMPONENT AND ELECTRONIC COMPONENT MOUNTING STRUCTURE

CROSS REFERENCE TO RELATED APPLICATIONS

This application claims the benefit of priority to Japanese Patent Application No. 2019-086320 filed on Apr. 26, 2019. The entire contents of this application are hereby incorporated herein by reference.

BACKGROUND OF THE INVENTION

1. Field of the Invention

The present invention relates to a chip electronic component and an electronic component mounting structure, and, more particularly, to an improvement of a terminal portion of the chip electronic component.

2. Description of the Related Art

In a multilayer ceramic capacitor as one example of a chip electronic component, as a voltage is applied between external electrodes, dielectric polarization occurs between adjacent inner electrodes facing each other. Capacitance resulting from the dielectric polarization is extracted through the external electrodes.

A dielectric contributing to the formation of the capacitance due to the inner electrodes facing each other as described above, causes electric field-induced strain in response to a voltage applied to the multilayer ceramic capacitor. If the multilayer ceramic capacitor is surface mounted on the substrate, the multilayer ceramic capacitor deforms the substrate due to the electric field-induced strain, and the frequency of the deformation makes a sound, called "squeal". An increase of "squeal" causes noise issues.

For example, as shown in FIG. 15, in order to suppress the squeal to address the above problem, an electronic component is proposed which includes an interposer 3 on the mounting surface of a multilayer ceramic capacitor 2 in order to inhibit solder from wetting (see Japanese Patent Laying-Open No. 2015-135910).

Since interposer 3 has a first main surface 4 and a first portion 5 located away from edges of the first main surface 4, the solder wetting over third connection electrodes 6 is inhibited from wetting and spread directly to first portion 5 across the edges of first main surface 4. Thus, an amount of wetting of the solder is restricted and an amount of the solder reaching the multilayer capacitor is reduced.

However, with the configuration of interposer 3 as shown in FIG. 15, interposer 3 is not made of a material that absorbs solder. Thus, interposer 3 may not be able to inhibit the solder from wetting.

SUMMARY OF THE INVENTION

Preferred embodiments of the present invention provide chip electronic components and electronic component mounting structures in each of which bumps, which have a desired mechanical strength and are capable of absorbing solder, are disposed on an electronic component main body, thus reducing or preventing generation of squeal.

A chip electronic component according to a preferred embodiment of the present invention includes a stack, a first external electrode, a second external electrode, a first bump, and a second bump. The stack includes a plurality of ceramic layers that are stacked, and a plurality of inner electrodes stacked on the plurality of ceramic layers, the stack including a first main surface and a second main surface opposed each other in a thickness direction of the stack, a first side surface and a second side surface opposed each other in a width direction of the stack perpendicular or substantially perpendicular to the thickness direction, and a first end surface and a second end surface opposed each other in a length direction of the stack perpendicular or substantially perpendicular to the thickness direction and the width direction. The first external electrode is disposed at least on the first end surface and the first main surface of the stack. The second external electrode is disposed at least on the second end surface and the first main surface of the stack. The first bump is electrically connected to the first external electrode. The second bump is electrically connected to the second external electrode. The first bump is disposed at least on a portion of the first external electrode on the first main surface. The second bump is disposed at least on a portion of the second external electrode on the first main surface. The first bump and the second bump each have a porosity greater than or equal to about 5% and less than or equal to about 40%.

Since the chip electronic component includes the first bump and the second bump each having a porosity greater than or equal to about 5%, the chip electronic component is capable of absorbing solder used to mount the chip electronic component onto the mounting substrate. For this reason, when solder is used to mount the chip electronic component onto the mounting substrate, an excess amount of the solder is able to be reduced or prevented from wetting. Additionally, since the first bump and the second bump each have a porosity less than or equal to about 40%, each bump has a desired mechanical strength, and a stable mounting structure is therefore maintained. As a result, generation of squeal is able to be reduced or prevented.

According to preferred embodiments of the present invention, the bumps that are capable of absorbing the solder are disposed on the electronic component main body, thus providing chip electronic components and electronic component mounting structures that are each capable of reducing or preventing generation of squeal.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A through 8E show a flowchart illustrating main portions of one example of a method for manufacturing the chip electronic component of FIG. 1, and, more particularly, a flowchart for forming bumps on an electronic component main body.

FIGS. 9A through 9E show a flowchart illustrating main portions of another example of the method for manufacturing the chip electronic component of FIG. 1, more particularly, a flowchart for forming bumps on the electronic component main body.

DETAILED DESCRIPTION OF THE PREFERRED EMBODIMENTS

1. Chip Electronic Component

Figure 1:
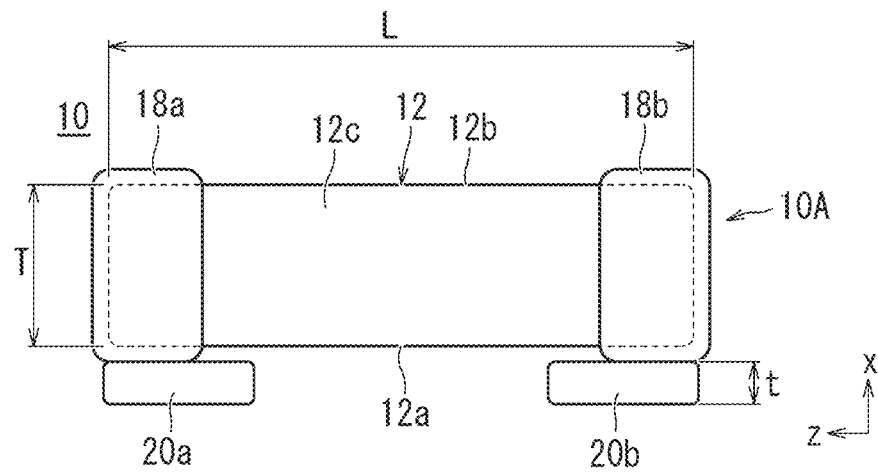
FIG. 1 is a side view of a chip electronic component according to a preferred embodiment of the present invention.

Referring to FIGS. 1 to 3B, a chip electronic component 10 according to a preferred embodiment of the present invention will be described. In the present preferred embodiment, chip electronic component 10 includes a multilayer ceramic capacitor as an electronic component main body 10A.

Chip electronic component 10 includes electronic component main body 10A. Electronic component main body 10A includes a chip stack 12. Stack 12 has a cuboid or substantially cuboid shape. Stack 12 includes first and second main surfaces 12a and 12b opposed each other, first and second side surfaces 12c and 12d opposed each other, and first and second end surfaces 12e and 12f opposed each other, the first and second side surfaces 12c and 12d and the first and second end surfaces 12e and 12f connecting the first and second main surfaces 12a and 12b. Stack 12 typically has curved ridges and corners, for example.

Here, a direction connecting first main surface 12a and second main surface 12b of stack 12 is defined as a thickness direction x. A direction perpendicular or substantially perpendicular to thickness direction x and connecting first side surface 12c and second side surface 12d is defined as a width direction y. A direction perpendicular or substantially perpendicular to thickness direction x and width direction y and connecting first end surface 12e and second end surface 12f is defined as a length direction z. These terms will be used in the following description.

A dimension of stack 12 in thickness direction x will be referred to as a T dimension. A dimension of stack 12 in width direction y will be referred to as a W dimension. A dimension of stack 12 in length direction z will be referred to as an L dimension.

Figure 3A:
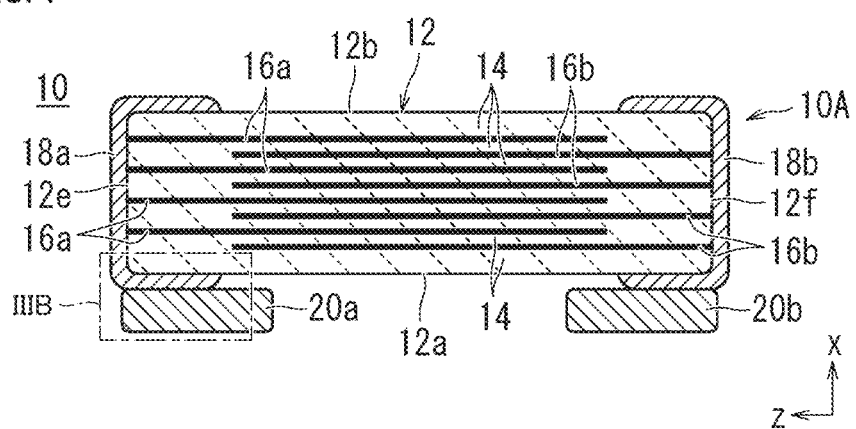
FIG. 3A is a cross-sectional view of the chip electronic component, taken along IIIA-IIIA line indicated in FIG. 2.

As shown in FIG. 3A, stack 12 includes multiple ceramic layers 14 that are stacked, and multiple first inner electrodes 16a and second inner electrodes 16b which are provided along the interfaces between the ceramic layers 14. Ceramic layer 14 is preferably made of, a dielectric ceramic. For example, first inner electrodes 16a and second inner electrodes 16b preferably include Ni as a conductive component. First inner electrodes 16a and second inner electrodes 16b may further include a dielectric particle having the same or similar composition system as the ceramic included in ceramic layer 14.

Each of inner electrodes 16a and 16b includes an edge exposed to end surfaces 12e and 12f of stack 12, respectively. First inner electrodes 16a exposed to first end surface 12e of stack 12 and second inner electrodes 16b exposed to second end surface 12f are alternately disposed within stack 12 so as to generate capacitances via ceramic layers 14.

In order to extract the capacitances mentioned above, a first external electrode 18a and a second external electrode 18b are provided on first end surface 12e and second end surface 12f, respectively. First external electrode 18a is electrically connected to first inner electrodes 16a. Second external electrode 18b is electrically connected to second inner electrodes 16b. External electrodes 18a and 18b each preferably include a baked layer formed by baking, for example, a conductive paste including a metal as a conductive component. The baked layer may preferably be Ni plated or Sn plated, for example. Note that the baked layer includes at least one metal selected from, for example, Cu, Ni, Ag, Pd, Ag—Pd alloy, Au, etc. The baked layer may include glass. The baked layer preferably includes, for example, at least one glass selected from among B, Si, Ba, Mg, Al, Li, etc.

First external electrode 18a, provided on first end surface 12e of stack 12, extends to a portion of each of first and second main surfaces 12a and 12b and a portion of each of first and second side surfaces 12c and 12d, the portions each being adjacent to first end surface 12e.

Second external electrode 18b, provided on second end surface 12f of stack 12, extends to a portion of each of first and second main surfaces 12a and 12b and a portion of each of first and second side surfaces 12c and 12d, the portions being adjacent to second end surface 12f.

Figure 6:
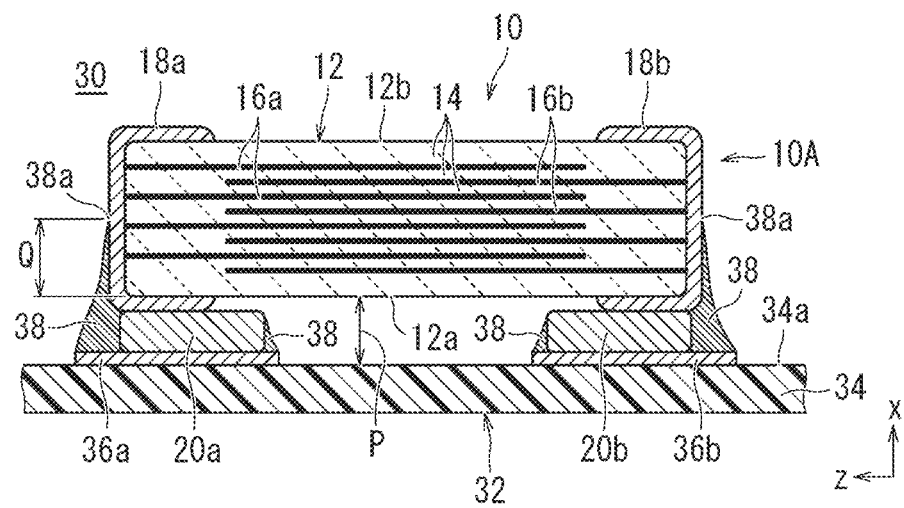
FIG. 6 is a cross-sectional view of an electronic component mounting structure according to a preferred embodiment of the present invention in which the chip electronic component of FIG. 1 is mounted on the mounting substrate.

As shown in FIG. 6, first main surface 12a of chip electronic component 10 is a mounting surface facing the mounting substrate 32 side. Accordingly, in the following description, the reference sign "12a" will be used to refer to "the first main surface" and "the mounting surface."

A first bump 20a is disposed at least on a portion of first external electrode 18a on the first main surface (mounting surface) 12a. A second bump 20b is disposed at least on a portion of second external electrode 18b on the first main surface (mounting surface) 12a. Note that first bump 20a and second bump 20b may extend to other surfaces of stack 12.

First bump 20a and second bump 20b each include an intermetallic compound as the main component. The intermetallic compound preferably includes, for example, one type of high melting point metal selected from among Cu and Ni, and includes Sn as a low melting point metal. Preferably, the intermetallic compound is obtained by a reaction between Sn and Cu—Ni alloy, for example. Such an intermetallic compound has advantages, such as a high reaction rate and less changes in shape during the production. Note that Ag may further be included as a high melting point metal of the intermetallic compound.

Figure 3B:
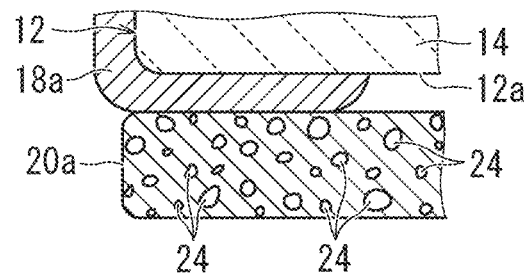
FIG. 3B is an enlarged cross-sectional view of the region IIIB indicated in FIG. 3A, representing a joint between an external electrode and a bump.

As shown in FIG. 3B, pores 24 are provided within first bump 20a and second bump 20b. Percentages at which pores 24 are provided is a ratio of the area of pores 24 to the pore-free area of a LT cross section exposed through the center or approximate center of bumps 20a and 20b in width direction y in a binary image. First bump 20a and second bump 20b each preferably have a porosity greater than or equal to about 5% and less than or equal to about 40%, for example. More preferably, first bump 20a and second bump 20b each have a porosity greater than or equal to about 10% and less than or equal to about 20%, for example.

As shown in FIG. 1, first bump 20a and second bump 20b are disposed on the mounting surface 12a side, and each have a given thickness dimension t in a direction perpendicular or substantially perpendicular to mounting surface 12a. In order to more reliably provide the advantageous effects of mitigating "squeal" described below, preferably, first bump 20a and second bump 20b each have thickness dimension t greater than or equal to about 30 μm and less than or equal to about 200 μm, for example. If first bump 20a and second bump 20b each have thickness dimension t greater than about 30 μm, the solder is prevented from wetting over the end surfaces of mounting chip electronic component 10 when mounting chip electronic component 10 on mounting substrate 32, which leads to squeal reduction or prevention. In contrast, if first bump 20a and second bump 20b each have thickness dimension t less than or equal to about 200 μm, for example, stability in mounting the chip electronic component 10 onto mounting substrate 32 can be increased.

First bump 20a is electrically connected to first external electrode 18a. Second bump 20b is electrically connected to second external electrode 18b. More specifically, as shown in FIGS. 1 to 3B, first bump 20a includes a portion that is in contact with first external electrode 18a. Furthermore, first bump 20a extends in length direction z of stack 12 so as to partially cover first main surface 12a of stack 12. Second bump 20b has a portion that is in contact with second external electrode 18b. Furthermore, second bump 20b extends in length direction z of stack 12 so as to cover a portion of first main surface 12a of stack 12.

Accordingly, viewing the chip electronic component 10 along thickness direction x, first bump 20a extends from a portion of first external electrode 18a to a portion of first main surface 12a of stack 12, and second bump 20b extends from a portion of second external electrode 18b to a portion of first main surface 12a of stack 12.

First bump 20a and second bump 20b being disposed as such can improve the squeal reduction or prevention effect.

Figure 2:
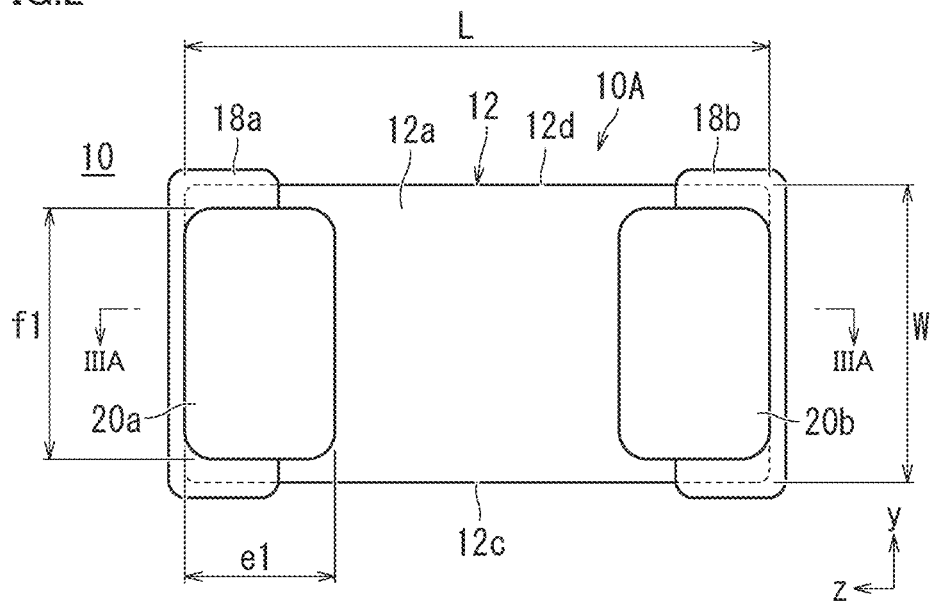
FIG. 2 is a bottom view of the chip electronic component of FIG. 1.

Furthermore, first bump 20a and second bump 20b each have a cuboid or substantially cuboid shape, as shown in FIGS. 1 and 2. Here, preferably, chip electronic component 10 satisfies the conditions about $0.15 \leq e1/L \leq$ about 0.4, for example, where e1 is the dimensions of bumps 20a, 20b in length direction z. The e1/L being in this range reduces or prevents tilting of the mounting of chip electronic component 10 as viewed along width direction y from sides 12c, 12d of chip electronic component 10. Thus, increased mounting stability on mounting substrate 32 can be achieved.

Note that first bump 20a and second bump 20b may have arc-shaped corners, for example.

Preferably, chip electronic component 10 satisfies the conditions about $1.2 \leq f1/e1 \leq$ about 1.8, and more preferably, about $1.3 \leq f1/e1 \leq$ about 1.7, for example, where f1 is the dimensions of bumps 20a, 20b in width direction y, and e1 is the dimension of bumps 20a, 20b in length direction z. The f1/e1 being in this range reduces or prevents tilting of the mounting of chip electronic component 10 as viewed from end surface 12e, 12f side of chip electronic component 10 along length direction z. Thus, increased mounting stability on mounting substrate 32 is achieved.

Furthermore, preferably, chip electronic component 10 satisfies the conditions about $0.14 \leq f1*e1/L*W \leq$ about 0.36, and more preferably, about $0.20 \leq f1*e1/L*W \leq$ about 0.30, for example, where f1 is the dimensions of bumps 20a, 20b in width direction y, e1 is the dimensions of bumps 20a, 20b in length direction z, L is the dimension of stack 12 in length direction z, and W is the dimension of stack 12 in width direction y. The f1*e1/L*W being in this range of the conditions can stabilize the standoff height (i.e., distance P described below) when mounting chip electronic component 10 on mounting substrate 32.

Note that when L dimension of stack 12 is about 1.767 mm and W dimension is about 0.961 mm, f1 is about 788.2 μm and e1 is about 498.1 μm, in which the bumps 20a, 20b have a thickness of about 138.1 μm. Moreover, when L dimension of stack 12 is about 1.762 mm and W dimension is about 0.963 mm, f1 is about 790.4 μm and e1 is about 506.7 μm, in which the bumps 20a, 20b have a thickness of about 138.4 μm. Furthermore, when L dimension of stack 12 is about 1.144 mm and W dimension is about 0.675 mm, f1 is about 559.5 μm and e1 is about 367.2 μm, in which the bumps 20a, 20b have a thickness of about 68.5 μm.

Figure 4A:
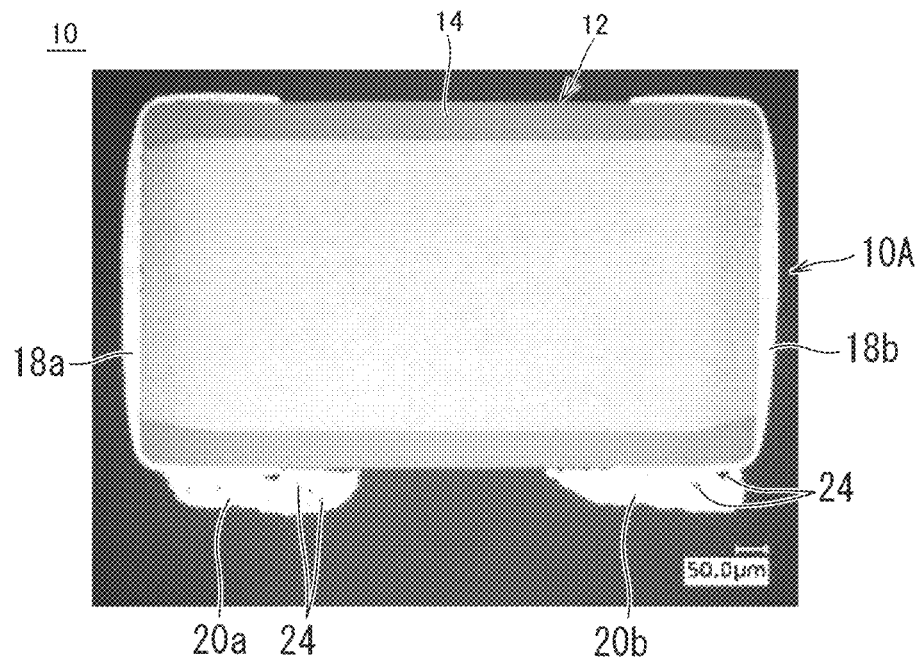
FIG. 4A is an electron microscope image of one example LT cross section of the chip electronic component of FIG. 1.
Figure 4B:
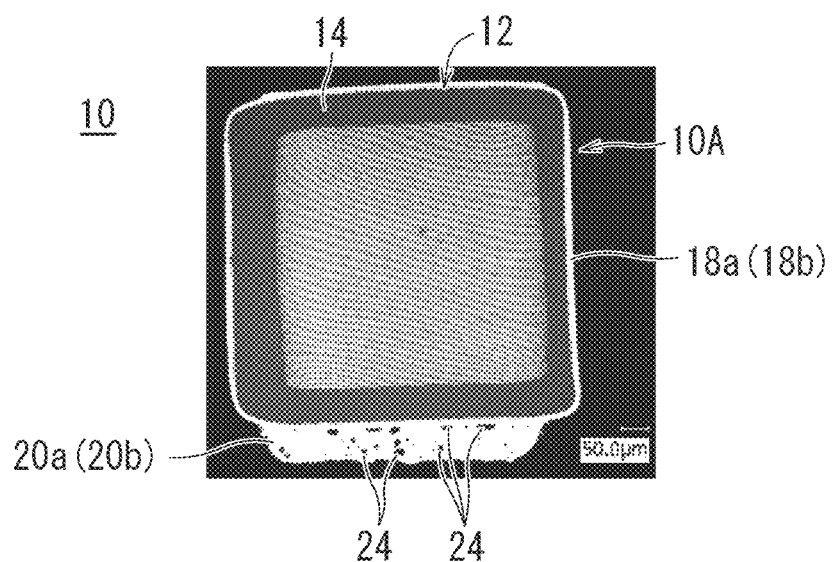
FIG. 4B is an electron microscope image of one example WT cross section of the chip electronic component of FIG. 1.

FIGS. 4A and 4B are electron microscope images each showing one example cross section of the chip electronic component of FIG. 1, FIG. 4A being an electron microscope image of an LT cross section of the chip electronic component, FIG. 4B being an electron microscope image of a WT cross section of the chip electronic component. As shown in FIGS. 4A and 4B, L dimension of the chip electronic component is about 1.144 mm.

Figure 5A:
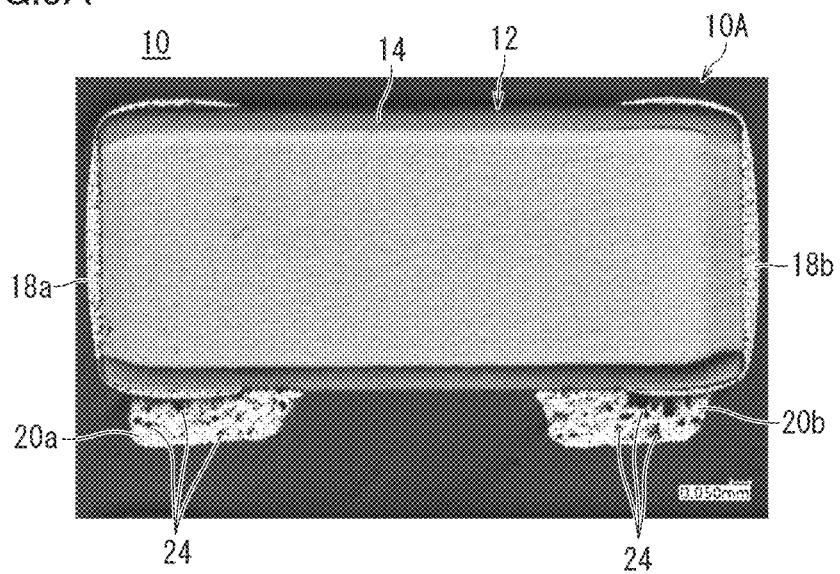
FIG. 5A is an electron microscope image of another example LT cross section of the chip electronic component of FIG. 1.
Figure 5B:
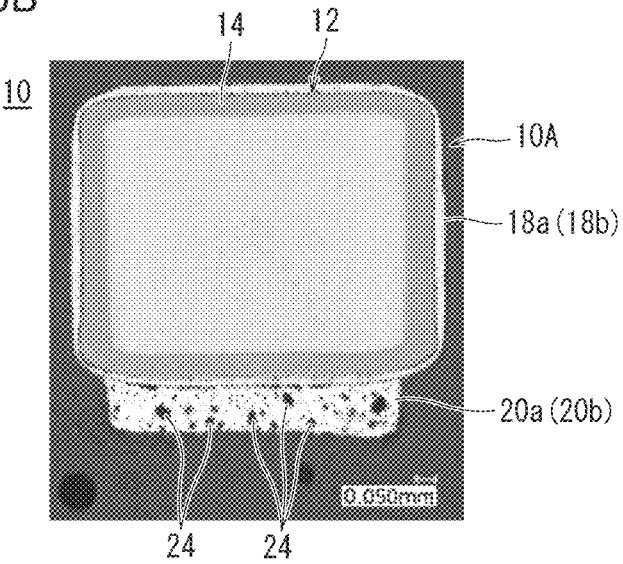
FIG. 5B is an electron microscope image of another example WT cross section of the chip electronic component of FIG. 1.

FIGS. 5A and 5B are electron microscope images each showing another example cross section of the chip electronic component of FIG. 1, FIG. 5A being an electron microscope image of an LT cross section of the chip electronic component, FIG. 5B being an electron microscope image of a WT cross section of the chip electronic component. As shown in FIGS. 5A and 5B, L dimension of the chip electronic component is about 1.767 mm.

It is understood that an increase in size of the chip electronic component increases the size of first bump 20a and second bump 20b, which leads to an increased number of pores 24.

In the chip electronic component 10 of FIG. 1, first bump 20a is electrically connected to first external electrode 18a, second bump 20b is electrically connected to second external electrode 18b, and first bump 20a and second bump 20b each have a porosity greater than or equal to about 5%. Thus, first bump 20a and second bump 20b absorb the solder used to mount chip electronic component 10 onto mounting substrate 32. Thus, the solder can be reduced or prevented from wetting over chip electronic component 10. Furthermore, since first bump 20a and second bump 20b each have a porosity less than or equal to about 40%, they have a desired mechanical strength and thus can maintain the stable mounting structure. As a result, chip electronic component 10 can provide squeal reduction or prevention effects.

2. Electronic Component Mounting Structure

Figure 7:
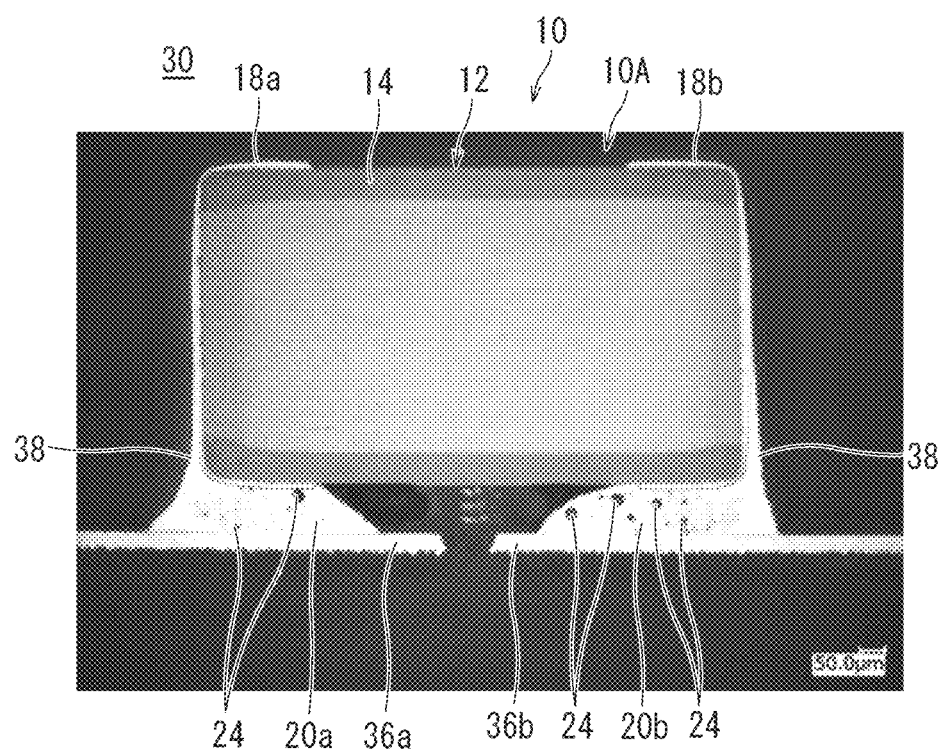
FIG. 7 is an electron microscope image of one example cross section of the electronic component mounting structure of FIG. 6.

Next, an electronic component mounting structure 30 of chip electronic component 10 according to a preferred embodiment of the present invention mounted on mounting substrate 32 will be described, with reference to FIG. 6. FIG. 7 is an electron microscope image showing one example cross section of the electronic component mounting structure shown in FIG. 6.

Electronic component mounting structure 30 includes, for example, chip electronic component 10 and mounting substrate 32, as shown in FIG. 6. Mounting substrate 32 includes a substrate main body 34. Substrate main body 34 is preferably made of, for example, a resin, such as a glass epoxy, or a ceramic, such as a glass ceramic. Substrate main body 34 includes, for example, multiple insulator layers that are stacked. One main surface of substrate main body 34 is a substrate-side mounting surface 34a. A first conductive land 36a and a second conductive land 36b are disposed on substrate-side mounting surface 34a in correspondence with first external electrode 18a and second external electrode 18b, respectively. When mounting chip electronic component 10 onto mounting substrate 32, first bump 20a is electrically connected and mechanically joined to first conductive land 36a via a solder 38, and second bump 20b is electrically connected and mechanically joined to second conductive land 36b via solder 38, at which time the solder 38 is absorbed to pores 24 provided in first bump 20a and second bump 20b. Solder 38 then forms a fillet along the sides of first bump 20a and second bump 20b.

Note that when mounting chip electronic component 10 onto mounting substrate 32 via solder 38, solder 38 may be disposed so that solder 38 enters the interface between first external electrode 18a and first bump 20a in length direction z from first the end surface 12e side to the second end surface 12f side and the interface between second external electrode 18b and second bump 20b in length direction z from the second end surface 12f side to the first end surface 12e side. As such, the securing force between first bump 20a and first conductive land 36a and the securing force between second bump 20b and second conductive land 36b can be improved.

Preferably, (i) solder 38 at the interface between first external electrode 18a and first bump 20a has a thickness greater than or equal to about 10 µm, for example, in thickness direction x at one half the dimension, in length direction z, of the portion of first external electrode 18a on first main surface 12a of stack 12, and (ii) solder 38 at the interface between second external electrode 18b and second bump 20b has a thickness greater than or equal to about 10 µm, for example, in thickness direction x at one half the dimensional, in length direction z, of the portion of second external electrode 18b on first main surface 12a of stack 12. This further improves the securing force between first bump 20a and first conductive land 36a and the securing force between second bump 20b and second conductive land 36b, thus improving the squeal reduction or prevention effects.

Moreover, preferably, in the mounting structure 30 of chip electronic component 10, solder 38 wets so as to extend past the first bump 20a to the portions of first external electrode 18a on first end surface 12e, first lateral surface 12c, and second lateral surface 12d of stack 12, and wets so as to extend past the second bump 20b to the portions of second external electrode 18b on second end surface 12f, first lateral surface 12c, and second lateral surface 12d of stack 12. At this time, preferably, chip electronic component 10 satisfies conditions P>Q, where P denotes the distance in thickness direction x between substrate-side mounting surface 34a of substrate main body 34 and first main surface 12a of stack 12 of chip electronic component 10, and Q denotes the distance in thickness direction x (i) from a plane coincide with first main surface 12a of stack 12 to edge 38a of solder 38 on first external electrode 18a on first end surface 12e, first lateral surface 12c, and second lateral surface 12d of stack 12 or (ii) from the plane coincide with first main surface 12a of stack 12 to edge 38a of solder 38 on second external electrode 18b on second end surface 12f, first lateral surface 12c, and second lateral surface 12d of stack 12. In other words, distance Q is less than distance P. This makes it possible to stably provide the squeal reduction or prevention effects.

Preferably, distance Q is greater than zero. In other words, edge 38a of solder 38 being closer to second main surface 12b of stack 12 than first main surface 12a of stack 12 can improve the securing force between chip electronic component 10 and mounting substrate 32.

Note that distance Q can be determined as follows. In other words, after chip electronic component 10 is mounted on mounting substrate 32, electronic component mounting structure 30 is polished along the LT surface to the center or approximate center thereof in width direction y (one half the dimension W) to determine the position of edge 38a of solder 38, and the distance from the plane coincide with first main surface 12a of stack 12 to edge 38a of solder 28 as distance Q.

As shown in FIG. 6, according to electronic component mounting structure 30, since chip electronic component 10, which includes first bump 20a and second bump 20b each having a porosity greater than or equal to about 5%, for example, is mounted on mounting substrate 32, the solder can be absorbed with first bump 20a and second bump 20b, thus reducing or preventing an excessive amount of solder 38 from wetting when solder 38 is used to mount chip electronic component 10 onto mounting substrate 32. Furthermore, since first bump 20a and second bump 20b each have a porosity less than or equal to about 40%, for example, they have a desired mechanical strength. Thus, the stable mounting structure can be maintained. As a result, as shown in FIG. 6, electronic component mounting structure 30 can reduce or prevent generation of squeal.

3. Method for Manufacturing Chip Electronic Component

Next, one example of a process for manufacturing the electronic component main body (the multilayer ceramic capacitor) of chip electronic component 10 according to a preferred embodiment of the present invention will be described.

(1) Initially, dielectric sheets and a conductive paste for inner electrode are prepared. The dielectric sheets and the conductive paste for inner electrode include a binder and a solvent. However, a well-known organic binder or organic solvent can be used.

(2) Next, the conductive paste for inner electrode is printed in a given pattern on the dielectric sheet by, for example, screen printing or gravure printing, and an inner electrode pattern is thereby formed.

(3) Furthermore, a given number of dielectric sheets for outer layer, having no inner electrode pattern formed thereon, are stacked one on the other, on which dielectric sheets, each having an inner electrode formed thereon, are stacked in sequence, on which a given number of dielectric sheets for outer layer are stacked. A stacked sheet is thereby fabricated.

(4) The stacked sheet is pressed in the direction of stacking by, for example, an isostatic press, thus fabricating a stacked block.

(5) Next, the stacked block is cut to cleave out a stacked chip having a given size, at which time the corners and ridges of the stacked chip may be curved by tumbling, for example.

(6) Furthermore, the stacked chip is fired, thus fabricating stack 12. Preferably, the firing temperature at this time is about 900 degrees Celsius to about 1300 degrees Celsius, for example, depending on the materials of the dielectric and the inner electrodes.

(7) A conductive paste for external electrode is applied to opposing end surfaces of stack 12 and baked, thus forming a baked layer for external electrodes. Preferably, the baking temperature at this time is about 700 degrees Celsius to about 900 degrees Celsius, for example.

(8) Furthermore, if necessary, the surface of the baked layer is plated.

As described above, a multilayer ceramic capacitor, which is electronic component main body 10A, is fabricated.

Next, an example of a bump formation process for forming first bump 20a and second bump 20b on the electronic component main body (the multilayer ceramic capacitor) 10A fabricated according to the above described process, will be described below, with reference to FIGS. 8A to 8E and FIGS. 9A to 9E.

Initially, one example of the bump formation process will be described, with reference to FIGS. 8A to 8E.

Step 1: Alignment of Electronic Component Main Bodies

Initially, as shown in FIG. 8A, electronic component main bodies 10A are aligned at given positions on a holding substrate 40, using a suction nozzle 42.

Holding substrate 40 is capable of holding electronic component main bodies 10A and is heat resistant. Holding substrate 40 is, for example, an alumina plate to which a metallic material paste is not joined under reflow conditions, the alumina plate having a double sided tape made of polyimide applied thereto.

Step 2: Bump Formation Process

Next, a metallic material paste 44 is prepared. Metallic material paste 44 preferably includes, for example, one type of high melting point metal selected from among Cu and Ni, which is a material for first bump 18a and second bump 18b, and Sn as a low melting point metal. Note that the porosity of the bumps can be increased by increasing the Sn content.

Then, as shown in FIG. 8B, metallic material paste 44 is formed in a desired pattern by screen printing, for example, using a squeegee 48 on electronic component main bodies 10A aligned on holding substrate 40.

For this reason, for example, a masking jig 46 is prepared. Masking jig 46 is disposed on electronic component main bodies 10A aligned on holding substrate 40. As shown in FIG. 8B, masking jig 46 includes, for example, a mask plate 46 having a rectangular or substantially rectangular shape in plan view. Mask plate 46a includes multiple through holes 46b passing therethrough from one main surface to the other main surface. Through holes 46b each have a rectangular or substantially rectangular shape in plan view. Dimension e1 and dimension f1 of the bump depend on the size of the rectangular or substantially rectangular shape of through holes 46b in plan view.

Then, as shown in FIG. 8C, metallic material pastes 44 are formed, partially covering external electrodes 18a and 18b of electronic component main body 10A.

Note that as another way of forming bumps in a desired pattern by metallic material paste 44, the bumps can be formed by applying metallic material paste 44 in a given pattern to electronic component main bodies 10A, using a dispenser by a dispensing method, etc.

Step 3: Reflow Process

Next, as shown in FIG. 8D, electronic component main bodies 10A, including metallic material pastes 44 formed thereon, are subject to a reflow process. This causes the metal included in metallic material pastes 44 to generate an intermetallic compound, and metallic material pastes 44 are cured.

Step 4: Separation Process Subsequent to Thermal Curing

After metallic material pastes 44 are thermally cured, stack 12 and bumps 20a and 20b joined to external electrodes 18a and 18b are formed as shown in FIG. 8E, thus manufacturing chip electronic components 10. Chip electronic components 10 are then separated from holding substrate 40.

With the above method, chip electronic components 10 which include bumps 20a and 20b are manufactured.

Next, another example of the bump formation process will be described, with reference to FIGS. 9A through 9E.

Step 1: Bump Formation Process

Initially, a metallic material paste 44 is prepared. Metallic material paste 44 preferably includes, for example, one type of high melting point metal selected from among Cu and Ni, which is a material for first bump 20a and second bump 20b, and Sn as a low melting point metal. Note that the porosity of the bumps can be increased by increasing the Sn content.

Furthermore, holding substrate 40 for forming metallic material paste 44 in a desired pattern is prepared.

Then, as shown in FIG. 9A, metallic material paste 44 is printed on holding substrate 40 by, for example, screen printing using squeegee 48 in a desired pattern as shown in FIG. 9B. For this reason, masking jig 46 is prepared. Masking jig 46 is disposed on holding substrate 40.

Note that as another way of forming bumps in a desired pattern on holding substrate 40 by metallic material paste 44, the bumps can be formed by applying metallic material paste 44 in a given pattern using a dispenser by a dispensing method, etc., for example.

Step 2: Process of Mounting Electronic Component Main Bodies

Next, as shown in FIG. 9C, the prepared electronic component main bodies 10A are mounted on holding substrate 40 in an orientation in which the mounting surfaces 12a face the holding substrate 40, at which time the external electrodes 18a and 18b of electronic component main body 10A and a single bump formed of the metallic material paste are aligned together, causing the single bump to adhere to electronic component main body 10A.

Step 3: Reflow Process

Next, in the state of Step 2, electronic component main bodies 10A are subjected to a reflow process, as shown in FIG. 9D. This forms bumps 20a and 20b joined to electronic component main body 10A and external electrodes 18a and 18b.

Step 4: Separation Process after Thermal Curing

After electronic component main bodies 10A are thermally cured, stack 12 and bumps 20a and 20b joined to external electrodes 18a and 18b are formed as shown in FIG. 9E, thus manufacturing chip electronic components 10. Chip electronic components 10 are then separated from holding substrate 40.

With the above method, chip electronic components 10 which include bumps 20a and 20b are manufactured.

4. Accommodation Process into Carrier Tape

Next, chip electronic components 10 are accommodated in a carrier tape, using a taping apparatus (not shown) to manufacture an electronic component series 50 (an accommodation process into a carrier tape). The taping apparatus includes a parts feeder, a linear feeder to convey chip electronic components 10 supplied from the parts feeder, and a rotor to accommodate chip electronic components 10, received from the linear feeder, into a carrier tape. The orientation of chip electronic component 10 is screened, for example, twice on the linear feeder before being accommodated into the carrier tape.

Figure 10A:
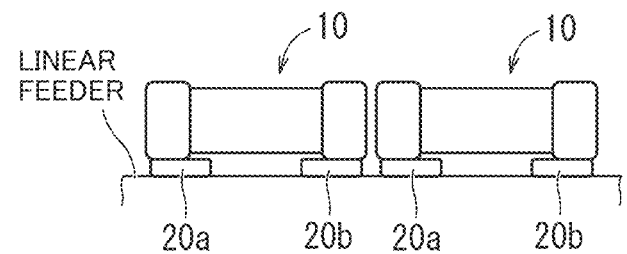
FIGS. 10A and 10B are schematic views each representing image recognition of chip electronic components, which is conveyed by a linear feeder, by a camera, FIG. 10A being a diagram of chip electronic components disposed in a proper orientation, FIG. 10B being a diagram of chip electronic components disposed in an improper orientation.
Figure 10B:
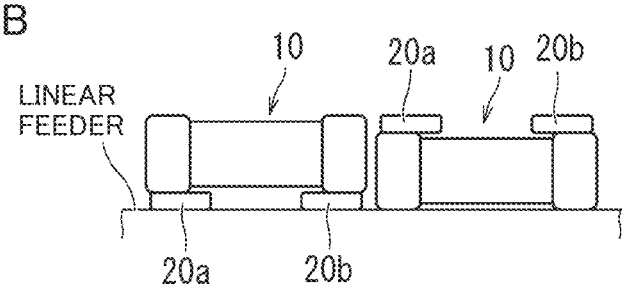

In a first orientation screening process, as shown in FIGS. 10A and 10B, chip electronic component 10, supplied from the parts feeder to the linear feeder, is image recognized by a camera from the side to be screened whether it is in a given orientation. Here, FIG. 10A is a diagram showing chip electronic components disposed in a proper orientation. FIG. 10B is a diagram showing a chip electronic component disposed in an improper orientation. In other words, first bump 20a and second bump 20b of chip electronic components 10 in FIG. 10A are located on the lower side of the image schematically shown, and the chip electronic components are thus determined as being disposed in the proper orientation. In FIG. 10B, in contrast, first bump 20a and second bump 20b of chip electronic component 10 are located on the upper side of the image schematically shown, and thus the chip electronic component is determined to be disposed in an improper orientation.

Figure 11A:
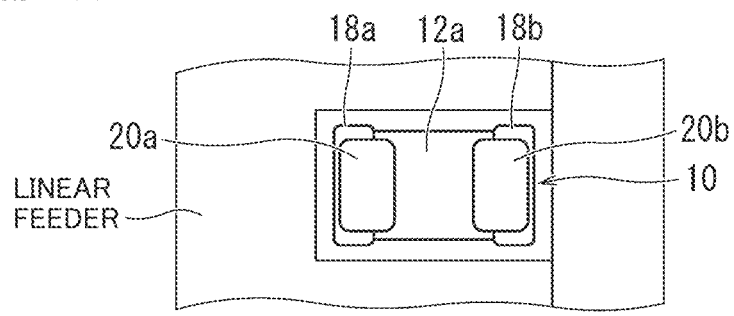
FIGS. 11A and 11B are schematic views each representing image recognition of a chip electronic component, which is conveyed by the linear feeder, by a camera from the bottom, FIG. 11A being a diagram of a chip electronic component disposed in a proper orientation, FIG. 11B being a diagram of a chip electronic component disposed in an improper orientation.
Figure 11B:
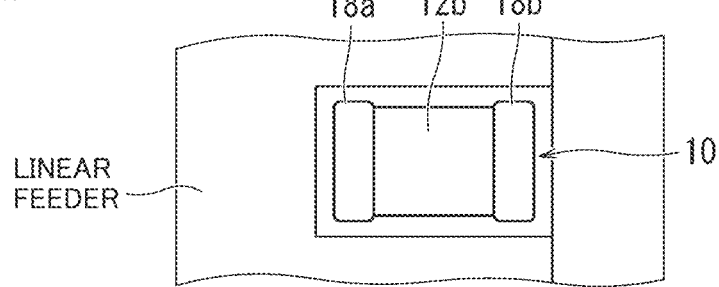

Then, in a second orientation screening process, chip electronic component 10, further conveyed through the first orientation screening process, is image recognized by a camera from the bottom, as shown in FIGS. 11A and 11B, to screen whether it is in a given orientation. Here, FIG. 11A is a diagram showing chip electronic components disposed in a proper orientation. FIG. 11B is a diagram showing chip electronic components disposed in an improper orientation. In other words, FIG. 11A shows the bottom side of chip electronic component 10, and the presence of first bump 20a and second bump 20b is recognized. Thus, the chip electronic components are determined to be disposed in the proper orientation. FIG. 11B, in contrast, shows the top side of a chip electronic component 10, and the presence of first bump 20a and second bump 20b is not recognized, and the presence of first external electrode 18a and second external electrode 18b is recognized. Thus, the chip electronic component is determined to be disposed in an improper orientation.

For example, a mechanism for rotating chip electronic component 10 by 90 degrees is provided for chip electronic component 10 that is conveyed in an improper orientation, to align chip electronic components 10 in the proper orientation.

If chip electronic component 10 is not placed in the proper orientation even with the above method, for example, chip electronic component 10 in an improper orientation is ejected off the linear feeder by an air injection device, and returned to the parts feeder.

Figure 12:
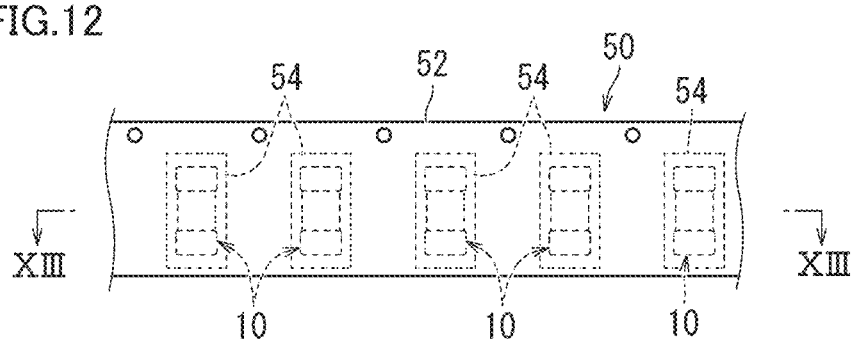
FIG. 12 is a plan view of an electronic component series.
Figure 13:
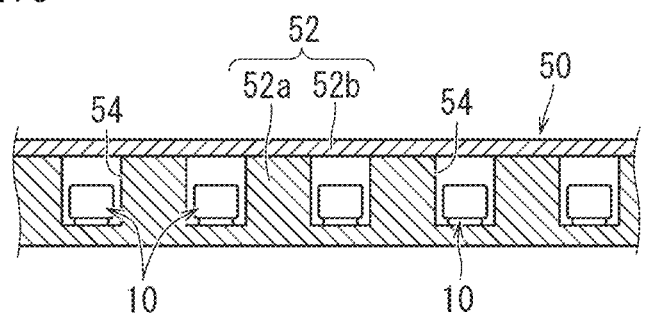
FIG. 13 is a cross-sectional view of the electronic components, taken along XIII-XIII line indicated in FIG. 12.

As shown in FIGS. 12 and 13, electronic component series 50 includes multiple chip electronic components 10 being taped. Electronic component series 50 includes an elongated tape 52. As shown in FIG. 13, tape 52 includes an elongated carrier tape 52a and an elongated cover tape 52b. Carrier tape 52a includes multiple cavities 54 spaced apart from one another along the length direction. Cover tape 52b is disposed on carrier tape 52a, covering cavities 54. Chip electronic component 10 is accommodated in each cavity 54.

For such an electronic component series 50, multiple chip electronic components 10 are aligned using, for example, a conveying apparatus (not shown) for chip electronic components 10. Chip electronic components 10 are then accommodated in cavities 54 in carrier tape 52a. Each cavity 54 accommodating chip electronic component 10 is then covered with cover tape 52b.

Electronic component series 50 is fabricated in this manner.

5. Experimental Example

Next, an Experimental Example will be described, which was performed to confirm the "squeal" mitigation effects provided by a chip electronic component 10 included in the multilayer ceramic capacitor according to the present preferred embodiment.

(1) Sound Pressure Measurement Device

Figure 14:
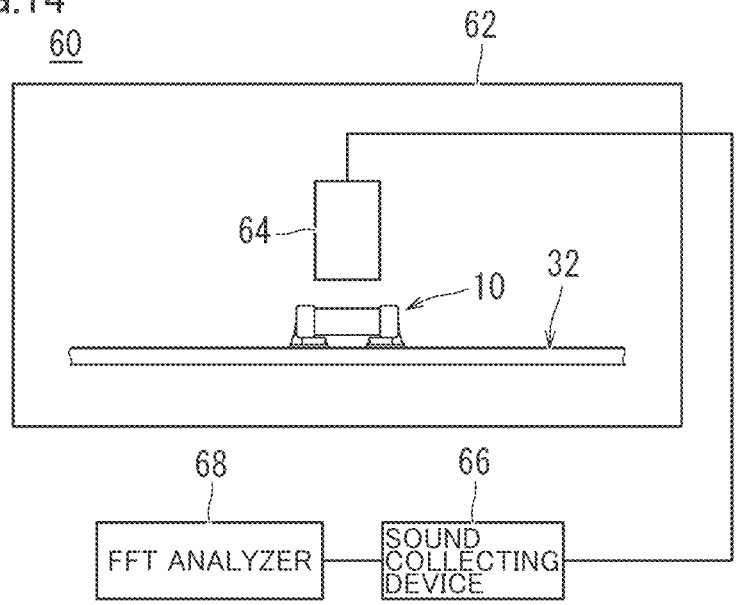
FIG. 14 is a diagram showing a schematic configuration of a measurement device for measuring the sound pressure level of noise generated by "squeal" in the electronic component mounting structure.
Figure 15:
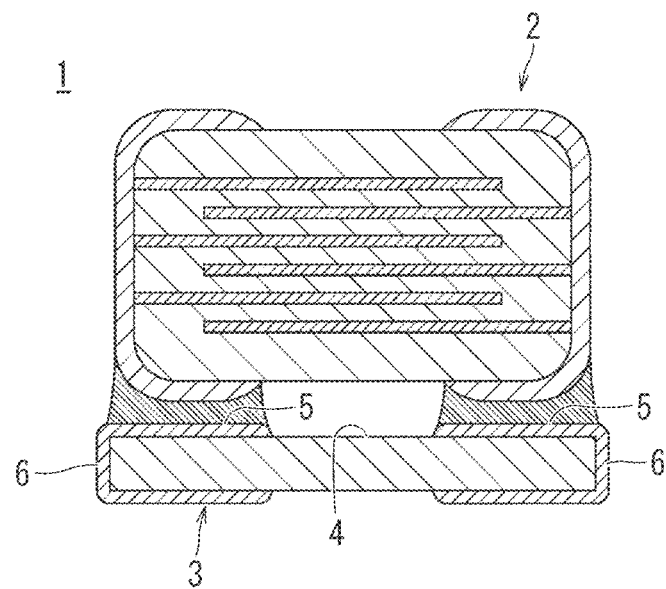
FIG. 15 is a cross-sectional view of one example of a conventional electronic component mounting structure having a measure against "squeal."

FIG. 14 shows a sound pressure measurement device 60 to measure the sound pressure level of noise generated by "squealing" of chip electronic component 1 included in the multilayer ceramic capacitor according to the present preferred embodiment. Referring to FIG. 14, mounting substrate 32 with chip electronic component 1 mounted thereon is installed in an anechoic box 62, while a sound collecting microphone 64 is disposed facing the mounting substrate 32. Then, an AC voltage having, for example, a frequency of about 3 kHz and a voltage of about 1 Vpp is applied to chip electronic component 10 included in the multilayer ceramic capacitor. This causes chip electronic component 1 to deform mounting substrate 32 under the frequency, causing noise, called "squeal." The noise is collected by sound collecting microphone 64, and the output of sound collecting microphone 64 is input to an FFT (Fast Fourier Transform) analyzer 68 via a sound collecting device 66 and analyzed for the sound pressure level.

(2) Specifications of Sample in Experimental Example

Initially, an electronic component main body (multilayer ceramic capacitor) as below is produced, according to the above-described method for manufacturing a multilayer ceramic capacitor.

The stack size: L*W*T is shown in Table 1. The inner electrode has a thickness of about 0.56 µm, for example. The ceramic layer has a thickness of about 1.45 µm, for example. The number of stacked layers is 250 layers, for example. The permittivity is about 2500, for example. The capacitance is about 2.2 µF, for example. The external electrode includes an underlying electrode layer and a plating layer. The material of the underlying electrode layer is Cu, for example. The plating layer has a two-layer structure including a Ni plating layer and a Sn plating layer, for example. The external electrodes have a thickness of about 35 μm or greater and about 75 μm or less, for example.

TABLE 1

|  | L Dimension [mm] | W Dimension [mm] | T Dimension [mm] |
|---|---|---|---|
| Average | 1.146 | 0.675 | 0.727 |
| Standard Deviation: σ | 0.009 | 0.005 | 0.005 |

As a metallic material paste for forming bumps, for example, a metallic material paste is used which includes: about 31.5 wt % of Cu-10 wt % Ni powder having D50 of about 5 μm; about 58.5 wt % of solder powder having D50 of about 5 μm and having a composition of Sn-3 wt % Ag-0.5 wt % Cu; and about 10 wt % of flux.

Samples are prepared whose bump shape is cuboid or substantially cuboid, and dimension e1 of the bump in length direction z and dimension f1 of the bump in width direction y are as shown in Table 2. In other words, samples are prepared whose e1 is varied in the range from, for example, about 0.1 L to about 0.45 L as a ratio to L dimension and f1 in width direction y of the bump is varied from, for example, about 0.5 W to about 0.9 W as a ratio to W dimension. Note that the respective bumps have a thickness of, for example, about 67.6 μm (average). The number of samples for each bump shape is 20 samples, for example.

Table 2 shows results of measurement of the sound pressure levels of the samples having varying bump dimensions e1 and f1.

TABLE 2

| Sound Pressure Level | | Bump Length in Length Direction: e1 | | | | |
|---|---|---|---|---|---|---|
| [dB] | | 0.1 L | 0.2 L | 0.3 L | 0.4 L | 0.45 L |
| Bump Length in Width Direction: f1 | 0.5 W | 64.2 | 63.8 | 61.2 | 61.1 | Short Failure |
| | 0.6 W | 63.7 | 63.2 | 61.1 | 61.3 | Short Failure |
| | 0.7 W | 64.5 | 61.1 | 61.3 | 61.5 | Short Failure |
| | 0.8 W | 64.0 | 61.4 | 61.1 | 61.1 | Short Failure |
| | 0.9 W | 63.8 | 61.3 | 61.0 | 60.9 | Short Failure |

As shown in Table 2, for the samples whose dimension e1 of the bump in length direction z is about 0.3 L and about 0.4 L, a good sound pressure level of about 62 dB or lower is obtained for all the samples whose dimension f1 of the bump in width direction y is in the range from about 0.5 W to about 0.9 W. For the samples whose dimension e1 of the bump in length direction z is about 0.2 L, a good sound pressure level of about 62 dB or lower is obtained for samples whose dimension f1 of the bump in width direction y is in the range from about 0.7 W to about 0.9 W.

In contrast, for the samples whose dimension e1 of the bump in length direction z is about 0.1 L, the samples fails to function as a bump due to the small dimension e1 of the bump in length direction z, and a sound pressure level above 63 dB is obtained for all the samples whose dimension f1 of the bump in width direction y is from about 0.5 W to about 0.9 W. For the samples whose dimension e1 of the bump in length direction z is about 0.2 L, a sound pressure level above 63 dB is obtained for samples whose dimension f1 of the bump in width direction y in the range of about 0.5 W and about 0.6 W.

For the samples whose dimension e1 of the bump in length direction z is about 0.45 L, a short failure is caused due to the close distance between the first bump and the second bump in length direction z.

Next, Table 3 shows the ratio (f1*e1/L*W) of the area (f1*e1) of the bump to the area (L*W) of the mounting surface.

TABLE 3

| | | Bump Length in Length Direction: e1 | | | | |
|---|---|---|---|---|---|---|
| f1*e1/L*W | | 0.1 L | 0.2 L | 0.3 L | 0.4 L | 0.45 L |
| Bump Length in Width Direction: f1 | 0.5 W | 0.05 | 0.10 | 0.15 | 0.20 | Short Failure |
| | 0.6 W | 0.06 | 0.12 | 0.18 | 0.24 | Short Failure |
| | 0.7 W | 0.07 | 0.14 | 0.21 | 0.28 | Short Failure |
| | 0.8 W | 0.08 | 0.16 | 0.24 | 0.32 | Short Failure |
| | 0.9 W | 0.09 | 0.18 | 0.27 | 0.36 | Short Failure |

As shown in Table 3, it is suggested that, preferably, the area of the bump is about 0.14 or greater and about 0.36 or less, for example, relative to the area of the mounting surface for the samples that yield good sound pressure levels as shown in Table 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A chip electronic component, comprising:
    a stack including a plurality of ceramic layers that are stacked and a plurality of inner electrodes stacked on the plurality of ceramic layers, the stack including:
        a first main surface and a second main surface opposed each other in a thickness direction of the stack;
        a first lateral surface and a second lateral surface opposed each other in a width direction of the stack perpendicular or substantially perpendicular to the thickness direction; and
        a first end surface and a second end surface opposed each other in a length direction of the stack perpendicular to the thickness direction and the width direction;
    a first external electrode disposed at least on the first end surface and the first main surface of the stack;
    a second external electrode disposed at least on the second end surface and the first main surface of the stack;
    a first bump electrically connected to the first external electrode; and
    a second bump electrically connected to the second external electrode; wherein
    the first bump is disposed at least on a portion of the first external electrode on the first main surface;
    the second bump is disposed at least on a portion of the second external electrode on the first main surface;
    the first bump includes a portion that is in contact with the first external electrode;
    the second bump includes a portion that is in contact with the second external electrode; and
    the first bump and the second bump each have a porosity greater than or equal to about 5% and less than or equal to about 40%.

2. The chip electronic component according to claim 1, wherein the first bump and the second bump each have a thickness greater than or equal to about 30 μm and less than or equal to about 200 μm in the thickness direction.

3. The chip electronic component according to claim 1, wherein the chip electronic component satisfies about 0.15≤e1/L≤about 0.4, where e1 is a total dimension of the first bump and the second bump in the length direction, and L is a dimension of the stack in the length direction.

4. The chip electronic component according to claim 1, wherein
the first bump extends from a portion of the first external electrode to a portion of the first main surface of the stack when the chip electronic component is viewed along the thickness direction; and
the second bump extends from a portion of the second external electrode to a portion of the first main surface of the stack when the chip electronic component is viewed along the thickness direction.

5. The chip electronic component according to claim 1, wherein
the first bump and the second bump each have a cuboid or substantially cuboid shape; and
the chip electronic component satisfies about $1.2 \leq f1/e1 \leq$ about 1.8, where f1 is a total dimension of the first bump and the second bump in the width direction, and e1 is a total dimension of the first bump and the second bump in the length direction.

6. The chip electronic component according to claim 5, wherein the chip electronic component satisfies about $0.14 \leq f1*e1/L*W \leq$ about 0.36, where L is a dimension of the stack in the length direction and W is a dimension of the stack in the width direction.

7. An electronic component mounting structure, comprising:
the chip electronic component according to claim 1; and
a mounting substrate including a substrate main body including a mounting surface, and a conductive land on the mounting surface; wherein
the first bump and the second bump, included in the chip electronic component, are mounted on the conductive land via solder with the mounting surface of the mounting substrate and the first main surface of the chip electronic component facing each other.

8. The electronic component mounting structure according to claim 7, wherein
the solder is disposed at an interface between the first external electrode and the first bump and an interface between the second external electrode and the second bump.

9. The electronic component mounting structure according to claim 8, wherein
the solder at the interface between the first external electrode and the first bump has a thickness greater than or equal to about 10 μm in the thickness direction at about one half a dimension, in the length direction, of a portion of the first external electrode on the first main surface of the stack; and
the solder at the interface between the second external electrode and the second bump has a thickness greater than or equal to about 10 μm in the thickness direction at about one half a dimension, in the length direction, of a portion of the second external electrode on the first main surface of the stack.

10. The electronic component mounting structure according to claim 7, wherein the electronic component mounting structure satisfies Q>0, where Q is a distance in the thickness direction (i) from a plane coinciding with the first main surface of the stack to an edge of the solder on the first external electrode on the first end surface, the first lateral surface, and the second lateral surface, or (ii) from the plane coinciding with the first main surface of the stack to an edge of the solder on the second external electrode on the second end surface, the first lateral surface, and the second lateral surface of the stack.

11. The electronic component mounting structure according to claim 7, wherein the electronic component mounting structure satisfies P>Q, where P is a distance in the thickness direction from the mounting surface of the mounting substrate to the first main surface of the stack included in the chip electronic component, and Q is a distance in the thickness direction (i) from a plane coinciding with the first main surface of the stack to an edge of the solder on the first external electrode on the first end surface, the first lateral surface, and the second lateral surface, or (ii) from the plane coinciding with the first main surface of the stack to an edge of the solder on the second external electrode on the second end surface, the first lateral surface, and the second lateral surface of the stack.

12. The electronic component mounting structure according to claim 7, wherein the first bump and the second bump each have a thickness greater than or equal to about 30 μm and less than or equal to about 200 μm in the thickness direction.

13. The electronic component mounting structure according to claim 7, wherein the chip electronic component satisfies about $0.15 \leq e1/L \leq$ about 0.4, where e1 is a total dimension of the first bump and the second bump in the length direction, and L is a dimension of the stack in the length direction.

14. The electronic component mounting structure according to claim 7, wherein
the first bump extends from a portion of the first external electrode to a portion of the first main surface of the stack when the chip electronic component is viewed along the thickness direction; and
the second bump extends from a portion of the second external electrode to a portion of the first main surface of the stack when the chip electronic component is viewed along the thickness direction.

15. The electronic component mounting structure according to claim 7, wherein
the first bump and the second bump each have a cuboid or substantially cuboid shape; and
the chip electronic component satisfies about $1.2 \leq f1/e1 \leq$ about 1.8, where f1 is a total dimension of the first bump and the second bump in the width direction, and e1 is a total dimension of the first bump and the second bump in the length direction.

16. The electronic component mounting structure according to claim 15, wherein the chip electronic component satisfies about $0.14 \leq f1*e1/L*W \leq$ about 0.36, where L is a dimension of the stack in the length direction and W is a dimension of the stack in the width direction.

17. The chip electronic component according to claim 1, wherein the first and second external electrodes include a baked layer.

18. The chip electronic component according to claim 17, wherein the baked layer includes at least one metal selected from Cu, Ni, Ag, Pd, Ag—Pd alloy, or Au.

19. The chip electronic component according to claim 1, wherein the first bump and the second bump each include an intermetallic compound as a main component.

20. The chip electronic component according to claim 19, wherein the intermetallic compound includes a high melting point metal selected from Cu or Ni, and Sn as a low melting point metal.

* * * * *